(12) United States Patent
Ng et al.

(10) Patent No.: US 7,365,407 B2
(45) Date of Patent: Apr. 29, 2008

(54) LIGHT EMITTING DIODE PACKAGE WITH DIRECT LEADFRAME HEAT DISSIPATION

(75) Inventors: Kee Yean Ng, Penang (MY); Hui Peng Koay, Penang (MY); Chiau Jin Lee, Penang (MY); Kheng Leng Tan, Penang (MY); Wei Liam Loo, Penang (MY); Keat Chuan Ng, Penang (MY); Alzar Abdul Karim Norfidathul, Seberang Perai (MY)

(73) Assignee: Avago Technologies General IP Pte Ltd, Singapore (SG)

( * ) Notice: Subject to any disclaimer, the term of this patent is extended or adjusted under 35 U.S.C. 154(b) by 78 days.

(21) Appl. No.: 11/415,548

(22) Filed: May 1, 2006

(65) Prior Publication Data

US 2007/0252246 A1 Nov. 1, 2007

(51) Int. Cl.
| | |
|---|---|
| *H01L 31/0203* | (2006.01) |
| *H01L 23/495* | (2006.01) |
| *H01L 29/267* | (2006.01) |
| *H01L 29/22* | (2006.01) |
| *H01L 29/24* | (2006.01) |
| *H01L 21/00* | (2006.01) |
| *H01L 21/50* | (2006.01) |

(52) U.S. Cl. .................. 257/433; 257/81; 257/82; 257/99; 257/100; 257/676; 438/25; 438/122

(58) Field of Classification Search .......... 257/79–100, 257/431–437, 676; 438/24–26, 29, 48, 54, 438/64, 69–72, 122, 22
See application file for complete search history.

(56) References Cited

U.S. PATENT DOCUMENTS

2002/0163001 A1* 11/2002 Shaddock ............... 257/79
2006/0226435 A1* 10/2006 Mok et al. .............. 257/98

* cited by examiner

*Primary Examiner*—Luan Thai (57) ABSTRACT

A packaged circuit and method for packaging an integrated circuit are disclosed. The packaged circuit has a lead frame, an integrated circuit chip, and an encapsulating layer. The lead frame has first and second sections, the first section including a lateral portion, a chip mounting area and a first extension. The integrated circuit chip is mounted in the chip mounting area and is in thermal contact with the chip mounting area. The encapsulating layer has top, bottom, and first and second side surfaces. The first extension is bent to provide a first heat path from the chip mounting area to the bottom surface. The heat path connects the heat chip mounting area to the bottom surface without passing through the first and second side surfaces and provides a heat path that has less thermal resistance than the heat path through either the lateral portion or the second section.

7 Claims, 7 Drawing Sheets

LIGHT EMITTING DIODE PACKAGE WITH DIRECT LEADFRAME HEAT DISSIPATION

BACKGROUND OF THE INVENTION

Inexpensive integrated circuits often rely on a plastic leadframe form of packaging that is adapted for mounting on printed circuit boards via surface mounting technology rather than utilizing pins that must be inserted into holes in the printed circuit board. This type of integrated circuit typically has a die that is mounted on a leadframe. The die and part of the leadframe are encapsulated in an epoxy resin. The portions of the leadframe that extend outside the encapsulation provide electrical connections. These portions are bent into configurations that allow the package to be mounted onto the printed circuit board via surface mounting techniques.

This type of packaging arrangement is well suited for integrated circuits that do not dissipate significant amounts of heat. However, in applications in which the required heat dissipation is high, this packaging arrangement has problems. The heat from the small integrated circuit die must be transferred to some larger surface that can, in turn, transfer the heat to the air surrounding the heat-dissipating surface. There are two types of heat dissipating arrangements. In the first, the heat is transferred to an individual heat radiating structure that is coupled to the individual package. This structure can include fins to increase the surface area, and hence, provide sufficient surface area to transfer the heat to the surrounding air. While such packages can dissipate a significant amount of heat, the cost of the individual radiators is often prohibitive.

A second scheme utilizes the core of the printed circuit board to remove the heat from the various integrated circuits mounted on the board. The core of the printed circuit board has a much larger area than the area of the dies in the integrated circuits. In addition, some form of active heat transfer arrangement can be included on the printed circuit board or in the enclosure containing the printed circuit board. This heat dissipation scheme requires that the heat be moved from each integrated circuit die to the printed circuit board. One or more of the leads that extend from the package are often used for this heat removal function. For example, a lead that is connected to ground in the package can provide a heat path to the core of the printed circuit board, which typically, is also connected to ground. Unfortunately, these leads tend to have a small cross-sectional area and a relatively long length. Hence, the amount of heat that can be moved is limited. In addition, the thermal mass of the lead frame area is also limited, and hence, the package is subject to large thermal fluctuations as the integrated circuit is turned on and off.

Packages in which the die is mounted on a heat sink within the package and in which the heat sink is directly connected to the printed circuit board are also known. If the heat sink forms the bottom surface of the package, then the heat can be directly transferred to the printed circuit board. Unfortunately, such arrangements are subject to packaging failures since the heat sink is not encapsulated on all sides by the packaging material, and hence, can separate from the packaging material during repeated heating cycles during the operation of the packaged integrated circuit.

Other arrangements in which the heat sink is separated from the bottom of the package to allow encapsulation have also been proposed. In these arrangements, the heat sink is directly connected to the surface below the package by vias that are filled with solder. Such packages are significantly more expensive than the simple leadframe package, and hence, are not well suited for low cost integrated circuits such as LEDs.

SUMMARY OF THE INVENTION

The present invention includes a packaged circuit and method for packaging an integrated circuit. The packaged circuit has a lead frame, an integrated circuit chip, and an encapsulating layer. The lead frame has first and second sections, the first section including a lateral portion, a chip mounting area and a first extension. The integrated circuit chip is mounted in the chip mounting area and is in thermal contact with the chip mounting area. The encapsulating layer has top, bottom, and first and second side surfaces. The first extension is bent to provide a first heat path from the chip mounting area to the bottom surface. The heat path connects the heat chip mounting area to the bottom surface without passing through the first and second side surfaces. The first lateral portion extends from the chip mounting area through the first side surface and a portion of the second section extends through the second side surface. The first heat path has less thermal resistance than a heat path through either the lateral portion or the second section. In one aspect of the invention, the package could include a second extension that is connected to the chip mounting area and is bent downward to provide a second heat path from the chip mounting area to the bottom surface. In another aspect of the invention, the portion of the second section that extends through the side surface is bent to form a contact that is coplanar with the bottom surface.

DETAILED DESCRIPTION OF THE PREFERRED EMBODIMENTS OF THE INVENTION

Figure 1:
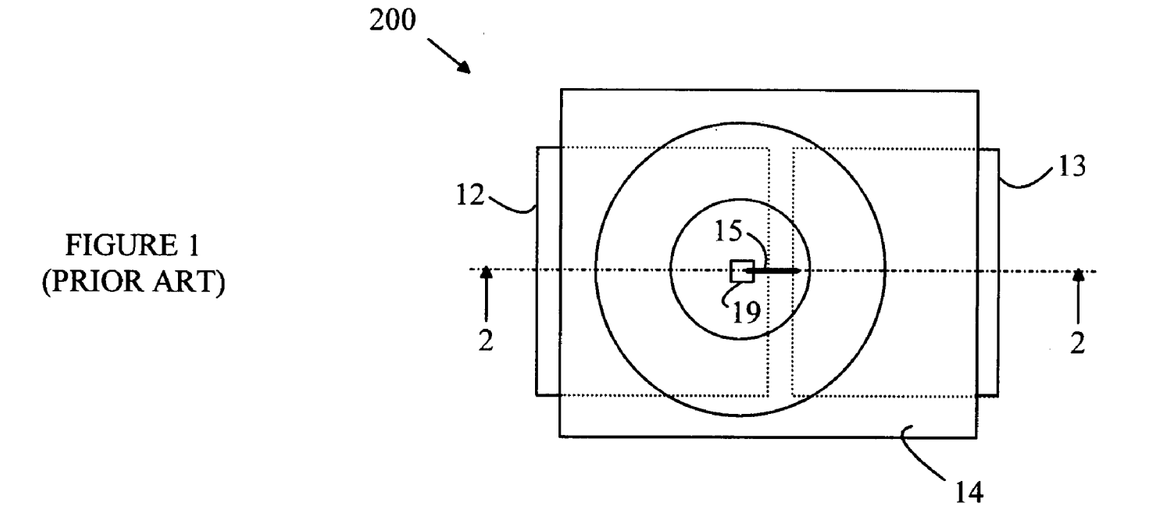
FIG. 1 is a top view of LED package 200.
Figure 2:
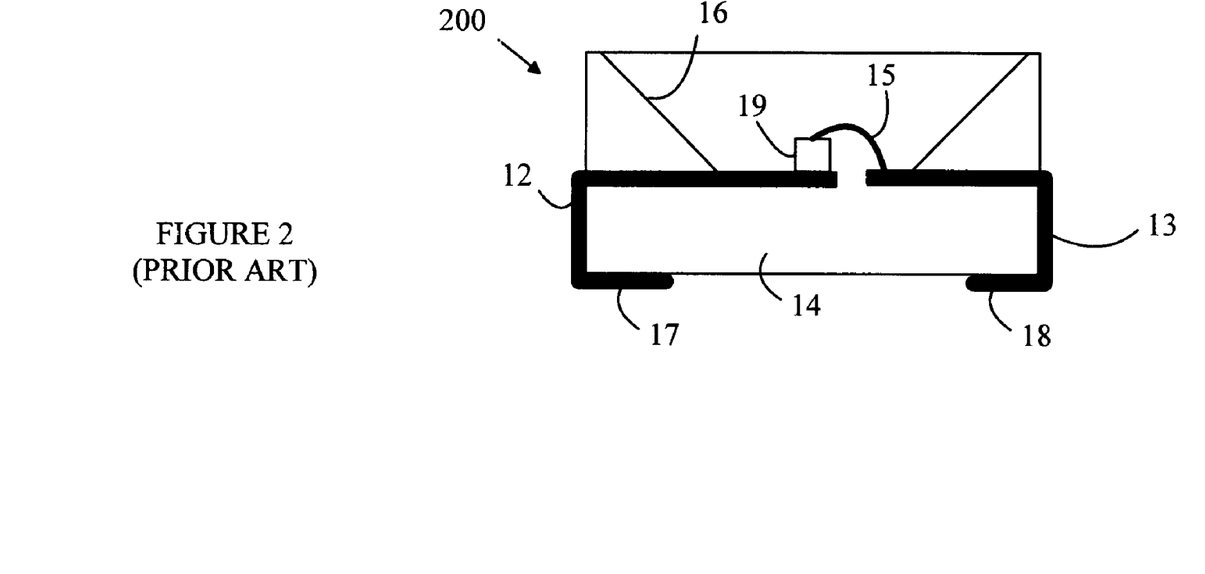
FIG. 2 is a cross-sectional view of LED package 200 through line 2-2 shown in FIG. 1.

The manner in which the present invention provides its advantages can be more easily understood with reference to FIGS. 1 and 2, which illustrate a prior art LED package. FIG. 1 is a top view of LED package 200, and FIG. 2 is a cross-sectional view of LED package 200 through line 2-2 shown in FIG. 1. The package is based on a leadframe having first and second sections shown at 12 and 13, respectively. The leadframe is encapsulated in a plastic material 14 that is molded to provide a cup 16. The interior surface of the cup is optionally plated with a reflective material so that light that leaves the edges of the LED is reflected in the forward direction. The portions of the leadframe that extend outside of the epoxy encapsulation are bent around the encapsulated material after the molding process. An LED 19 is affixed to leadframe portion 12 and connected by a wire bond 15 to leadframe portion 13. The cup is typically filled with a second epoxy mixture after the LED is mounted.

The packaged LED is mounted on a printed circuit board by soldering areas 17 and 18 to corresponding pads on the printed circuit board. Essentially all of the heat generated in LED 19 can be transferred to the printed circuit board via leadframe portion 12. The cross-sectional area of the leadframe is relatively small, since the material is thin. Hence, the thermal resistance of the long path from LED 19 to region 17 can be sufficient to cause the temperature of LED 19 to be elevated to an unacceptable value.

Figure 3A:
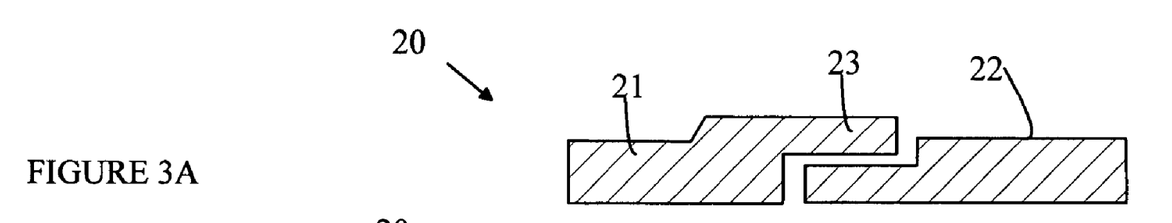
FIG. 3A is a top view of leadframe 20.
Figure 3B:
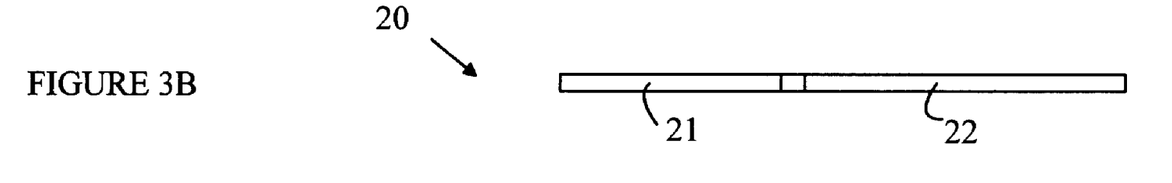
FIG. 3B is a side view of leadframe 20.

The present invention avoids this long heat path while maintaining the cost advantages of the surface mount encapsulated lead frame design. Refer now to FIGS. 3A and 3B, which illustrate a portion of a leadframe 20 used in one embodiment of the present invention. FIG. 3A is a top view of leadframe 20, and FIG. 3B is a side view of leadframe 20. The portion of the leadframe shown in FIG. 3A is utilized to make one packaged LED; however, it is to be understood that in the actual package, the lead frame includes a large number of elements joined by a structure that is removed when the devices are singulated. Leadframe 20 includes two sections shown at 21 and 22. Section 21 includes an extension 23 that extends alongside section 22.

Figure 4A:
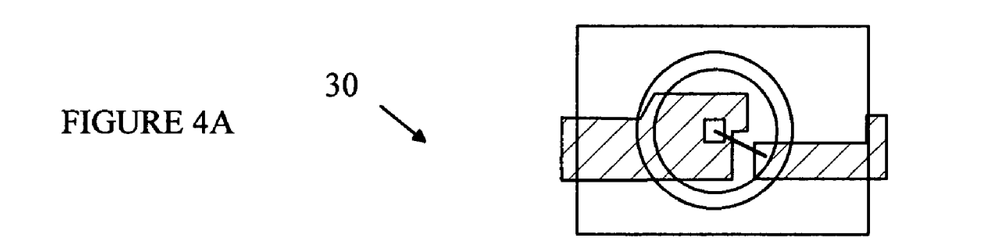
FIG. 4A is a top view of LED 30.
Figure 4B:
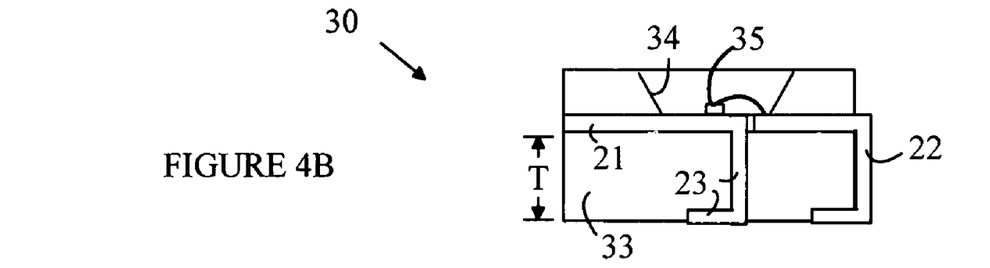
FIG. 4B is a side view of LED 30.

Refer now to FIGS. 4A and 4B, which illustrate a packaged LED 30 constructed from leadframe 20. FIG. 4A is a top view of LED 30, and FIG. 4B is a side view of LED 30. In practice, extension 23 shown in FIG. 3A is bent downward to form a contact that runs directly from the region under die 35 to the bottom surface of packaged LED 30. Section 22 is likewise bent to form a second contact that runs down the outside edge of the package. The bent leadframe is encapsulated in a plastic layer 33 that includes a cup 34. The light-emitting die 35 is bonded to section 21 to form one electrical contact that is accessed by extension 23. The remaining contact is formed by a wire bond that connects a terminal on die 35 to section 22.

Heat from die 35 is moved to the bottom surface of the package through extension 23. When the packaged LED is mounted on a printed circuit board, the heat is transferred to the printed circuit board via a solder connection to extension 23. It should be noted that the heat path from die 35 to the printed circuit board has a length that is determined by the thickness, T, of the epoxy encapsulant between the lead frame and the bottom of the package. This distance is much shorter than the path from the die via section 12 shown in FIGS. 1 and 2, above, and hence, the thermal resistance in the present invention is significantly less than that in the prior art packaged devices discussed above.

Figures 5, 6, 7:
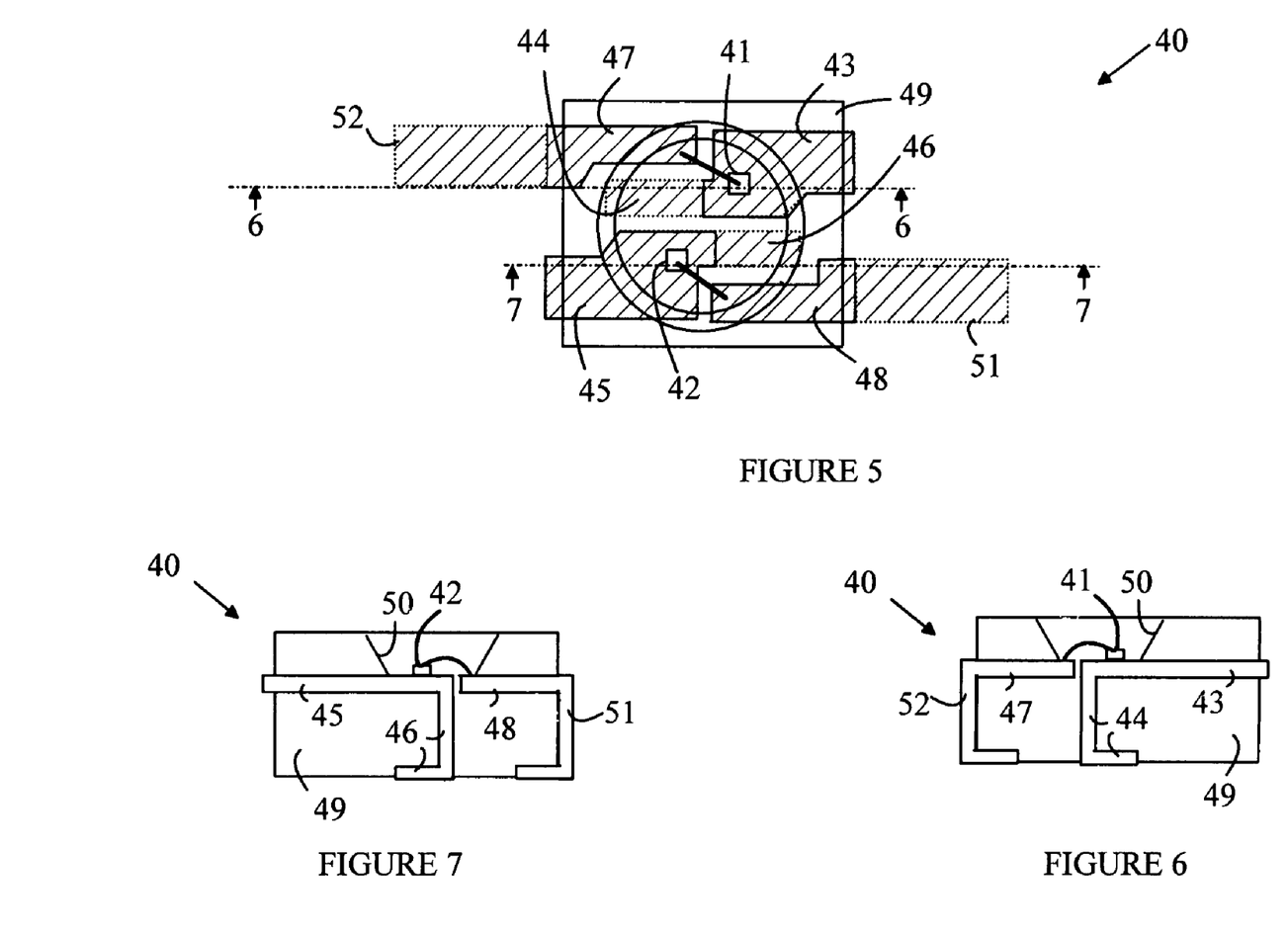
FIG. 5 is a top view of light source according to one embodiment of the present invention.
FIG. 6 is a cross-sectional view of light source 40 through line 6-6 shown in FIG. 5.
FIG. 7 is a cross-sectional view of light source 40 through line 7-7 shown in FIG. 5.

The above-described embodiments of the present invention provide a packaged light source with a single LED. However, the present invention may also be utilized to provide a packaged light source having multiple LEDs within a single cup. Refer to FIGS. 5-7, which illustrate an embodiment of a light source 40 according to another embodiment of the present invention. Light source 40 includes two LEDs. FIG. 5 is a top view of light source 40. FIG. 6 is a cross-sectional view of light source 40 through line 6-6 shown in FIG. 5, and FIG. 7 is a cross-sectional view of light source 40 through line 7-7 shown in FIG. 5. Referring to FIG. 5, each LED is mounted on a section of leadframe having an extension that is bent downward to provide the heat and electrical path to a point directly below the LED. For example, LED 41 is mounted on section 43 that includes an extension shown at 44 that is bent downward. Similarly, LED 42 is mounted on section 45 that includes an extension 46 that is bent downward. The lead frame also includes a section that forms the second contact for each of the LEDs. These sections are shown at 47 and 48. Each section includes an extension that is bent downward to form a contact on the bottom surface of the package. The extensions corresponding to sections 47 and 48 are shown at 52 and 51, respectively.

After the relevant leadframe extensions are bent, the leadframe is encapsulated in a plastic layer 49 that includes a molded cup 50. The LEDs are then mounted in the cup at the appropriate locations and wire bonded to form the second contact for each LED.

Figure 8A:
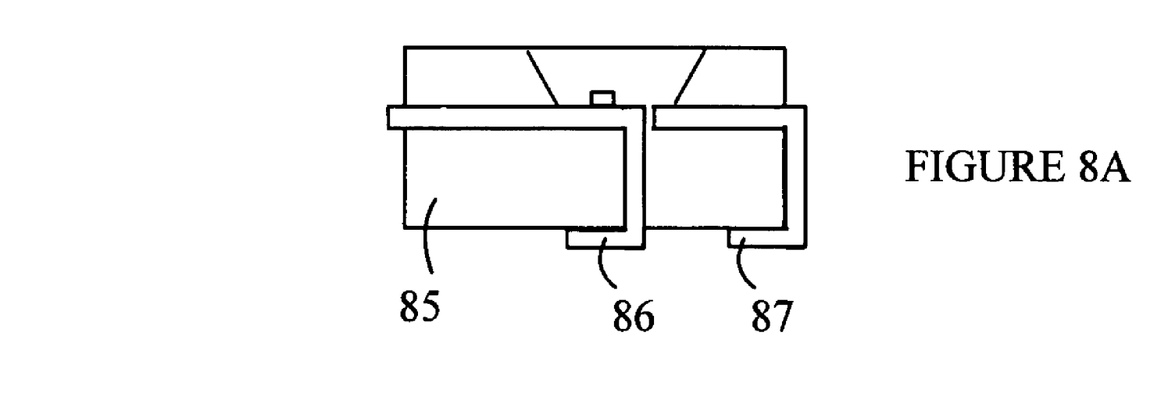
FIGS. 8A and 8B illustrate two other pad configurations.
Figure 8B:
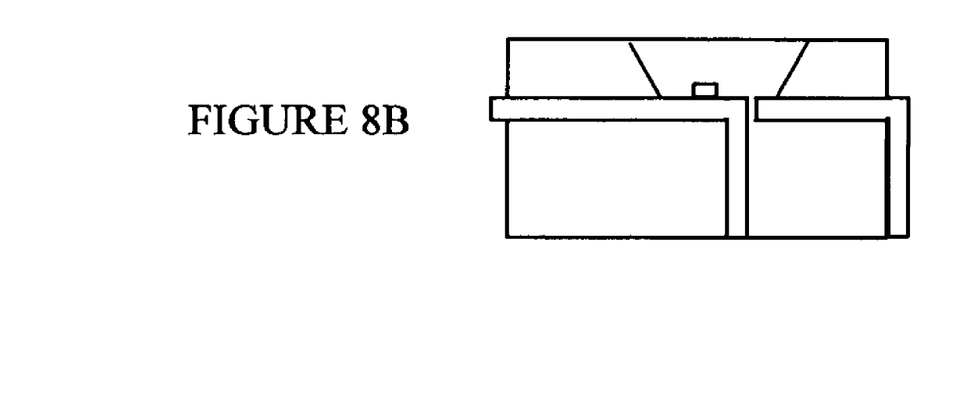

The above-described embodiments of the present invention utilize an extension that is bent into a pad that is flush with the bottom of the packaged part. However, other pad arrangements can be provided by altering the mold used to encapsulate the leadframe after the extension has been bent. Refer now to FIGS. 8A and 8B, which illustrate two other pad configurations. Referring to FIG. 8A, the encapsulating layer 85 can be molded such that pads 86 and 87 extend below the surface of the encapsulating layer. In this case, the plastic is molded after the extension is bent once. After the molding operation, a portion of the extension protrudes from the bottom of the molded portion. This portion is then bent to provide the pads.

The above-described embodiments require that the extensions be bent twice to produce the pads that are connected to the printed circuit board. However, embodiments in which the extensions are bent only once can also be constructed. Such an embodiment is shown in FIG. 8B. In this case, the ends of the extensions can be bonded to the printed circuit board using a solder ball or other arrangement.

The above-described embodiments utilize a single bent section of a leadframe to provide a direct heat path to the bottom of the packaged part, and hence, move the heat from the chip mounted on the leadframe to the printed circuit board on which the packaged part is mounted. The amount of heat that can be moved from the chip to the printed circuit board for any given chip temperature is determined by the cross-sectional area of the lead frame section and the distance between the chip and the underlying printed circuit board. The above-embodiments attempt to minimize the distance. However, in high power applications, additional reductions in the thermal resistance of the heat path from the chip to the printed circuit board may be needed.

Figure 9A:
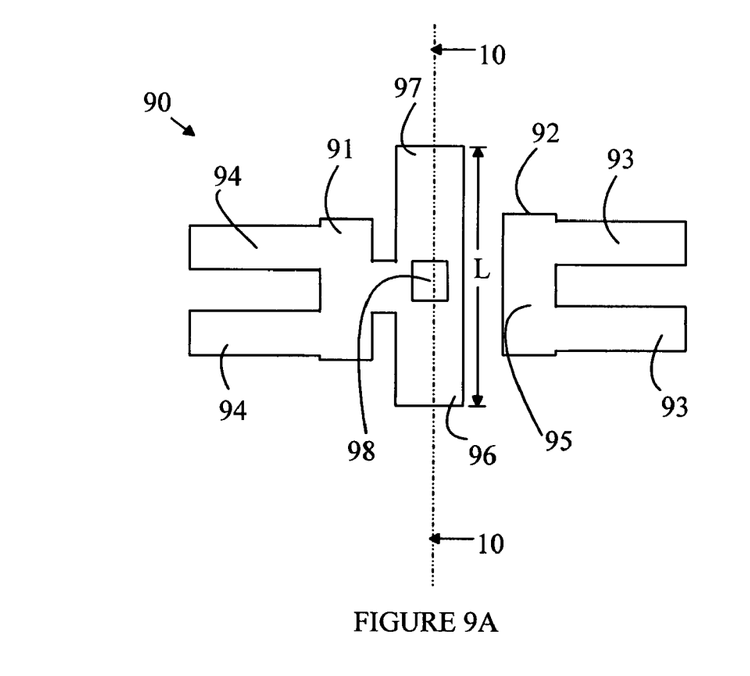
FIG. 9A is a top view of a portion of a leadframe 90 prior to the leadframe being bent.
Figure 9B:
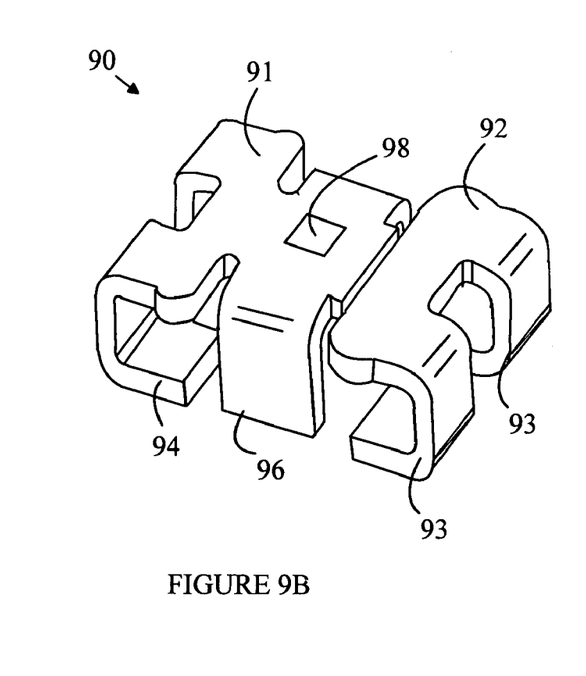
FIG. 9B is a perspective view of leadframe 90 after the various extensions have been bent.

Refer now to FIGS. 9A and 9B, which illustrate another embodiment of a leadframe according to the present invention. FIG. 9A is a top view of a portion of a leadframe 90 prior to the leadframe being bent. To simplify the drawing, only the portions of the leadframe that are actually incorporated in the final packaged part are shown. Leadframe 90 includes a first section 91 and a second section 92. Section 91 includes a chip mounting area 98 and two lateral extensions 96 and 97. Section 91 also includes two additional extensions 94 that can be used to provide an electrical contact to the bottom of the chip mounted in area 98. Similarly, section 92 includes two extensions 93 that provide electrical contacts to the other terminal of the chip mounted in area 98. The chip that is mounted in region 98 is wire bonded to region 95. This connection is made via a wire bond in a manner similar to that discussed above.

Refer now to FIG. 9B, which is a perspective view of leadframe 90 after the various extensions have been bent. Extensions 96 and 97 are bent downward in a manner similar to that described above to provide direct heat paths from the chip mounting area to a printed circuit board on which the packaged part is mounted. In the embodiment shown in FIG. 9B, extensions 96 and 97 have only a single bend, and hence, do not provide an extended mounting pad under the packaged part. In contrast, extensions 93 and 94 are bent twice and provide an increased contact area for surface mounting on the underlying printed circuit board. However, it will be appreciated that extensions 96 and 97 could be bent twice to provide a similar extended pad arrangement. It should be noted that some of the bends could be made after the leadframe is encapsulated in plastic in a manner similar to that described above.

The arrangement shown in FIGS. 9A and 9B provides both increased thermal mass and decreased thermal resistance. Since there are now two extensions that are bent to provide direct heat paths, the effective cross-sectional area of the heat path is increased. In addition, the thermal mass of the portion of the lead frame on which the chip is mounted is substantially increased relative to the embodiments discussed above, and hence, leadframe 90 has superior thermal buffering capabilities.

Referring again to FIG. 9A, the length of the extensions that are folded to provide the direct heat path depend on the manner in which the extensions are to be folded. In the arrangement shown in FIG. 9B, the length is determined by the distance from the leadframe platform on which the chip is mounted to the underlying printed circuit board in the mounted part. If more bends are to be provided, then the length, L, must be increased.

Figures 10A, 10B, 10C:
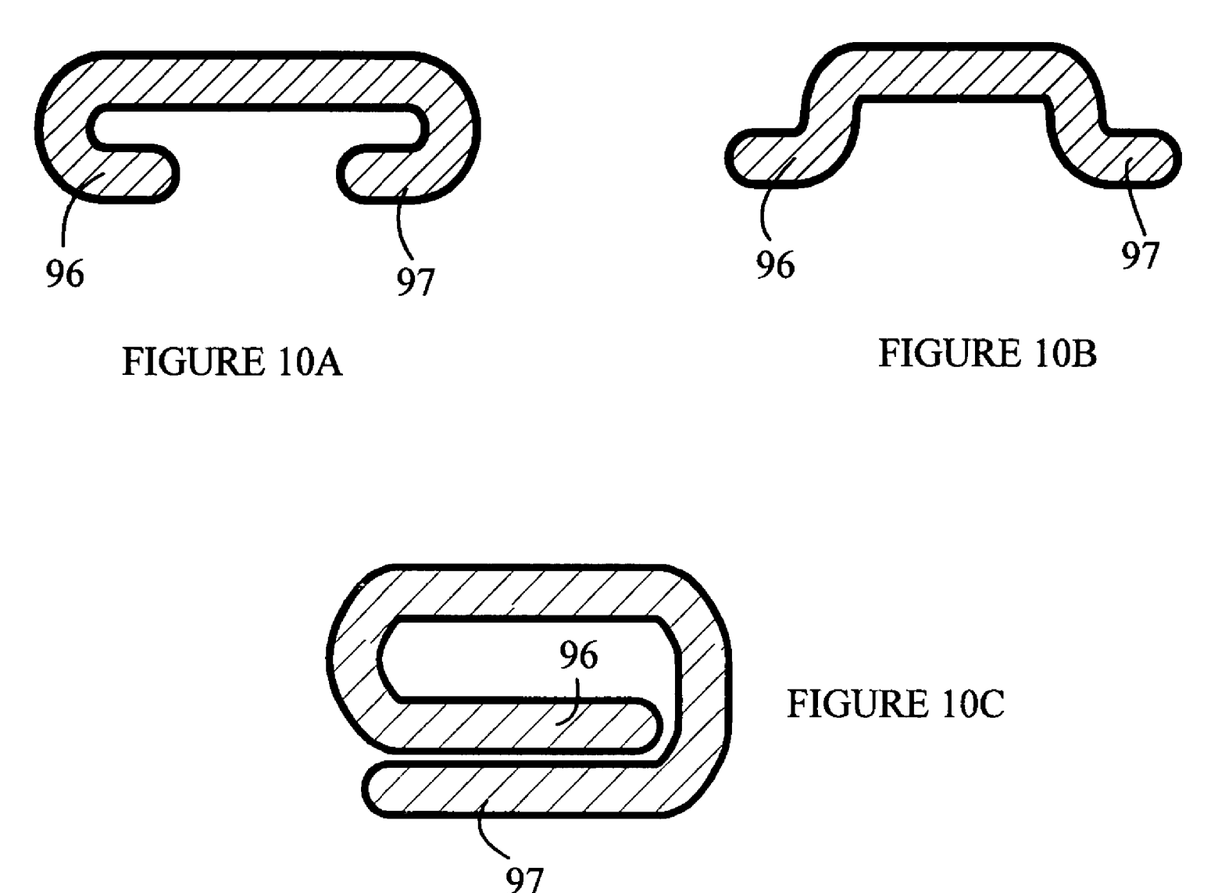
FIGS. 10A-10C are cross-sectional views through line 10-10 shown in FIG. 9A illustrating some other folding arrangements for the folded extensions.

Refer now to FIGS. 10A-10C, which are cross-sectional views through line 10-10 shown in FIG. 9A illustrating some other folding arrangements for the extensions. The arrangement shown in FIG. 10A provides flat connection pads under the packaged part that are analogous to pad 86 shown in FIG. 8A. The arrangement shown in FIG. 10B provides connection pads that are located outside the body of the packaged part. The arrangement shown in FIG. 10C provides additional thermal mass to reduce thermal fluctuations resulting from variations in the power dissipation as a function of time. It should be noted that extensions 96 and 97 can be bent such that the two extensions are in thermal contact in the finished part, and hence, this arrangement is equivalent to a solid heat sink having its bottom surface in contact with the printed circuit board on which the finished part is mounted.

The manner in which an LED is packaged in a package utilizing the lead frames discussed above will now be explained in more detail with reference to FIGS. 11A-11C, 12A-12C, and 13A-13C, which illustrate the packaging of an LED at various stages in the packaging process. To simplify the drawings and the following discussion, only the portion of the lead frame that is incorporated into a single part is shown; however, it is to be understood that this lead frame is joined with other lead frames in a sheet of such lead frames that are processed together.

Figure 11A:
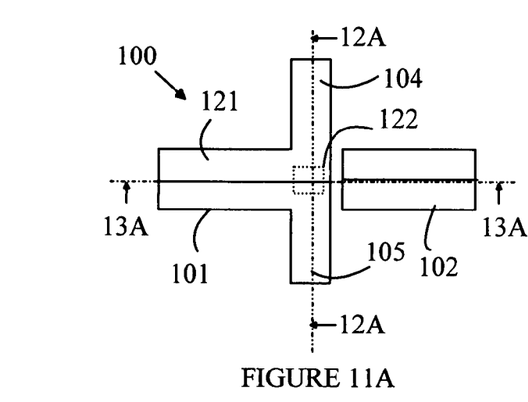
FIG. 11A is a top view of lead frame 100 prior to bending.
Figure 13A:
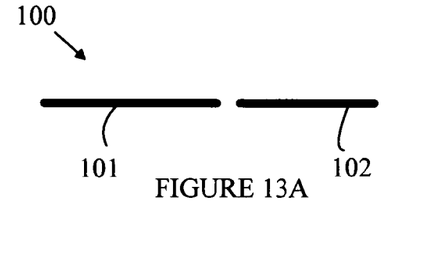
FIG. 13A is a cross-sectional view through line 13A-13A shown in FIG. 11A.

Refer now to FIGS. 11A-13A. FIG. 11A is a top view of lead frame 100 prior to bending. FIG. 12A is a cross-sectional view through line 12A-12A shown in FIG. 11A, and FIG. 13A is a cross-sectional view through line 13A-13A shown in FIG. 11A. Lead frame 100 includes two sections shown at 101 and 102. Section 102 includes extensions shown at 104 and 105 that will be bent downward in the final part. Section 101 also includes a lateral portion 121 and a chip mounting area 122. As noted above, the length of these extensions depends on the final configuration of the bent ends.

Figure 11B:
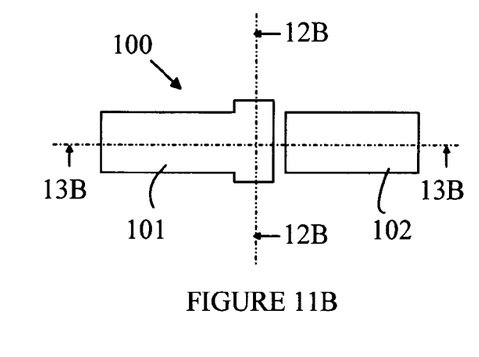
FIGS. 11B-11C are top views of lead frame 100 after the extensions have been bent.
Figure 13B:
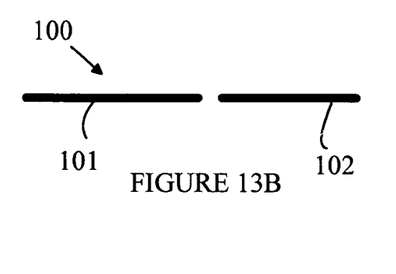
FIG. 13B is a cross-sectional view through line 13B-13B shown in FIG. 11B.

Refer now to FIGS. 11B-13B. FIG. 11B is top view of lead frame 100 after extensions 104 and 105 have been bent. FIG. 12B is a cross-sectional view through line 12B-12B shown in FIG. 11B, and FIG. 13B is a cross-sectional view through line 13B-13B shown in FIG. 11B. In the example shown in these figures, the extensions are bent to provide a direct heat path that terminates in two pads that are flush with the bottom of the package. However, as noted above, other configurations can be utilized.

Figure 11C:
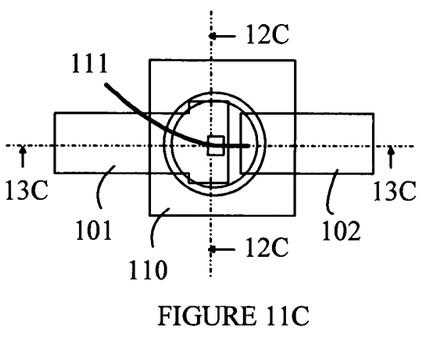
Figure 12A:
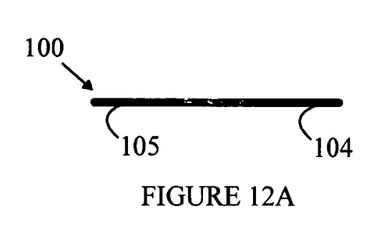
FIG. 12A is a cross-sectional view through line 12A-12A shown in FIG. 11A.
Figure 12B:
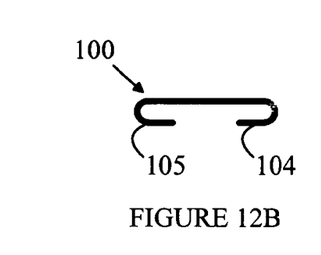
FIG. 12B is a cross-sectional view through line 12B-12B shown in FIG. 11B.
Figure 12C:
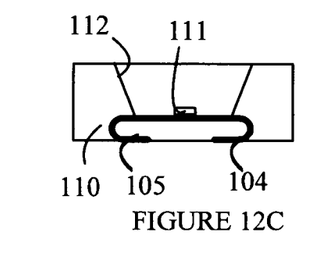
FIG. 12C is a cross-sectional view through line 12C-12C shown in FIG. 11C.
Figure 13C:
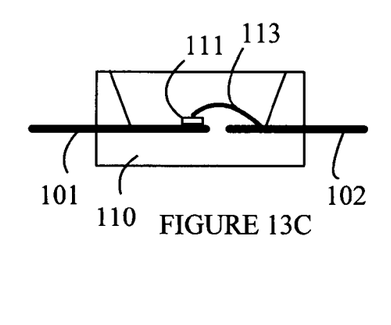
FIG. 13C is a cross-sectional view through line 13C-13C shown in FIG. 11C.

Refer now to FIGS. 11C-13C, which illustrate the part after the lead frame has been encapsulated in a layer of plastic 110. The leadframe is typically encapsulated with a plastic material, for example, PPA using a molding process. FIG. 11C is a top view of lead frame 100 after extensions 104 and 105 have been bent. FIG. 12C is a cross-sectional view through line 12C-12C shown in FIG. 11C, and FIG. 13C is a cross-sectional view through line 13C-13C shown in FIG. 11C. The epoxy encapsulant includes a cup 112 in which LED 111 is mounted on section 101. LED 111 is connected to section 102 by a wire bond 113. In the embodiment shown in these figures, the ends of sections 101 and 102 that extend outside the layer of encapsulant, are not bent. However, these ends can also be bent to conform to the outside of the final package or to some other configuration.

Various modifications to the present invention will become apparent to those skilled in the art from the foregoing description and accompanying drawings. Accordingly, the present invention is to be limited solely by the scope of the following claims.

What is claimed is:

1. A packaged circuit comprising:
   a leadframe having a first section and a second section, said first section comprising a lateral portion, a chip mounting area and a first extension;
   an integrated circuit chip mounted in said chip mounting area and in thermal contact with said chip mounting area;
   an encapsulating layer having a top surface, a bottom surface, a first side surface, a second side surface, and an interior region positioned between said top surface and said bottom surface, wherein, said first extension is bent so that it at least partially passes through said interior region toward said bottom surface in order to provide a first heat path from said chip mounting area to said bottom surface, said hear path connecting said hear chip mounting area to said bottom surface without passing through said first side surface and said second side surface, wherein said lateral portion extends from said chip mounting area through said first side surface and a portion of said second section extends through said second side surface, and wherein said first heat path has less thermal resistance than a heat path through either said lateral portion or said second section.

2. The packaged circuit of claim 1 further comprising a second extension, said second extension being connected to said chip mounting area and being bent downward to provide a second heat path from said chip mounting area to said bottom surfacer said second heat path having less thermal resistance than a heat path through either said lateral portion or said second section.

3. The packaged circuit of claim 1 wherein said first extension comprises a portion that extends through said bottom surface and is coplanar with said bottom surface.

4. The packaged circuit of claim 1 wherein said portion of said second section that extends through said second side surface is bent to form a contact that is coplanar with said bottom surface.

5. The packaged circuit of claim 4 wherein said contact is on said bottom surface.

6. The packaged circuit of claim 1 wherein said integrated circuit chip comprises an LED and wherein said encapsulating layer includes a cup having an opening through which said chip mounting area and a portion of said second section can be accessed.

7. The packaged circuit of claim 6 wherein said LED has a first contact connected to said chip mounting area and a second contact connected to said second section, said LED being powered by applying a potential difference between said first section and said second section.

* * * * *

UNITED STATES PATENT AND TRADEMARK OFFICE
CERTIFICATE OF CORRECTION

PATENT NO. : 7,365,407 B2
APPLICATION NO. : 11/415548
DATED : April 29, 2008
INVENTOR(S) : Kee Yean Ng et al.

It is certified that error appears in the above-identified patent and that said Letters Patent is hereby corrected as shown below:

Column 6, Line 66, Claim 1, delete "hear" and insert -- heat --;

Column 6, Line 67, Claim 1, delete "hear" and insert -- heat --;

Column 7, Line 13, Claim 2, delete "surfacer" and insert -- surface, --.

Signed and Sealed this

First Day of June, 2010

David J. Kappos
*Director of the United States Patent and Trademark Office*